(12) United States Patent
Kikuchi

(10) Patent No.: US 10,381,940 B2
(45) Date of Patent: Aug. 13, 2019

(54) RECTIFIER IC AND ISOLATED SWITCHING POWER SUPPLY USING SAME

(71) Applicant: Rohm Co., Ltd., Kyoto (JP)

(72) Inventor: Hiroki Kikuchi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 15/861,001

(22) Filed: Jan. 3, 2018

(65) Prior Publication Data

US 2018/0191260 A1    Jul. 5, 2018

(30) Foreign Application Priority Data

Jan. 5, 2017  (JP) ................................. 2017000385
Nov. 6, 2017  (JP) ................................. 2017213914

(51) Int. Cl.

| | | |
|---|---|---|
| H02M 3/335 | (2006.01) | |
| H02M 7/00 | (2006.01) | |
| H02M 7/02 | (2006.01) | |
| H01F 30/10 | (2006.01) | |
| H05K 1/16 | (2006.01) | |
| H01F 27/28 | (2006.01) | |
| H02M 1/42 | (2007.01) | |
| H02M 1/00 | (2006.01) | |

(52) U.S. Cl.
CPC .... H02M 3/33592 (2013.01); H01F 27/2804 (2013.01); H01F 30/10 (2013.01); H02M 1/4208 (2013.01); H02M 3/33507 (2013.01); H02M 3/33561 (2013.01); H02M 7/003 (2013.01); H02M 7/02 (2013.01); H05K 1/16 (2013.01); *H02M 2001/0058* (2013.01); *Y02B 70/1433* (2013.01); *Y02B 70/1475* (2013.01); *Y02B 70/1491* (2013.01)

(58) Field of Classification Search
CPC ................................ H02M 7/02; H02M 7/003
See application file for complete search history.

(56) References Cited

U.S. PATENT DOCUMENTS

| | | | | |
|---|---|---|---|---|
| 5,907,481 | A * | 5/1999 | Svardsjo | H02M 3/33592 363/25 |
| 6,064,580 | A * | 5/2000 | Watanabe | H02M 3/33592 363/127 |
| 9,112,422 | B1 * | 8/2015 | Vinciarelli | H02M 3/33507 |
| 9,468,087 | B1 * | 10/2016 | Joshi | H05K 1/0209 |
| 2001/0026462 | A1 * | 10/2001 | Tokunaga | H02M 3/33592 363/97 |
| 2004/0227547 | A1 * | 11/2004 | Shiraishi | H01L 23/495 327/110 |
| 2005/0218489 | A1 * | 10/2005 | Satou | H01L 23/49575 257/678 |

(Continued)

FOREIGN PATENT DOCUMENTS

JP    2008-067443    3/2008

Primary Examiner — Yusef A Ahmed
(74) Attorney, Agent, or Firm — Fish & Richardson P.C.

(57) ABSTRACT

A rectifier IC seals, in a single package, a first transistor chip which integrates a first transistor, a second transistor chip which integrates a second transistor and a controller chip which detects a first node voltage and a second node voltage of each of the transistors so as to perform on/off control on the transistors, and the rectifier IC functions as a secondary-side rectification means of an isolated switching power supply.

30 Claims, 13 Drawing Sheets

(56) References Cited

U.S. PATENT DOCUMENTS

| | | | | |
|---|---|---|---|---|
| 2005/0231990 A1* | 10/2005 | Uno | ................... | H01L 24/49 363/147 |
| 2006/0113664 A1* | 6/2006 | Shiraishi | ............... | H02M 7/003 257/723 |
| 2006/0114697 A1* | 6/2006 | Yasumura | ................. | H01F 3/14 363/16 |
| 2007/0278516 A1* | 12/2007 | Hashimoto | ............... | G06F 1/26 257/177 |
| 2009/0097280 A1* | 4/2009 | Wu | ................... | H02M 3/33592 363/17 |
| 2009/0109711 A1* | 4/2009 | Hsu | ................... | H02M 3/33592 363/21.14 |
| 2009/0161396 A1* | 6/2009 | Lin | ................... | H02M 3/33592 363/125 |
| 2010/0059875 A1* | 3/2010 | Sato | ................... | H01L 23/4952 257/690 |
| 2010/0109571 A1* | 5/2010 | Nishino | ............... | H02M 1/4208 315/307 |
| 2010/0171543 A1* | 7/2010 | Korec | ................. | H01L 23/49524 327/436 |
| 2010/0188871 A1* | 7/2010 | Kim | ................... | H02M 3/33592 363/21.03 |
| 2011/0096573 A1* | 4/2011 | Zhu | ................... | H02M 3/33523 363/21.17 |
| 2011/0096578 A1* | 4/2011 | Fang | ................. | H02M 3/33592 363/127 |
| 2011/0149620 A1* | 6/2011 | Havanur | ................. | H01L 23/62 363/56.08 |
| 2011/0182095 A1* | 7/2011 | Yang | ................... | H01L 25/074 363/127 |
| 2012/0061813 A1* | 3/2012 | Ho | ................... | H01L 23/49524 257/676 |
| 2012/0063175 A1* | 3/2012 | Wang | ................. | H02M 3/33592 363/21.14 |
| 2013/0001792 A1* | 1/2013 | Uno | ................. | H01L 23/49524 257/773 |
| 2013/0049137 A1* | 2/2013 | Uno | ................... | H01L 27/088 257/401 |
| 2013/0107582 A1* | 5/2013 | Sato | ................... | H02M 3/33592 363/21.06 |
| 2013/0223111 A1* | 8/2013 | Yang | ................... | H02M 7/217 363/53 |
| 2013/0250639 A1* | 9/2013 | Yang | ................... | H02M 7/06 363/126 |
| 2013/0329464 A1* | 12/2013 | Yang | ................. | H02M 3/33515 363/21.02 |
| 2014/0131843 A1* | 5/2014 | Balakrishnan | .... | H02M 3/33507 257/666 |
| 2014/0133186 A1* | 5/2014 | Balakrishnan | .... | H02M 3/33523 363/17 |
| 2015/0023062 A1* | 1/2015 | Hyugaji | ............ | H02M 3/33592 363/16 |
| 2015/0103563 A1* | 4/2015 | Wang | ................. | H02M 3/33592 363/17 |
| 2015/0229219 A1* | 8/2015 | Choi | ................. | H02M 3/33569 363/21.03 |
| 2015/0256087 A1* | 9/2015 | Jitaru | ................. | H02M 3/33546 363/21.06 |
| 2016/0049876 A1* | 2/2016 | Lee | ................... | H02M 3/33592 363/20 |
| 2016/0057822 A1* | 2/2016 | Chu | ................... | H02M 1/4208 315/201 |
| 2016/0094137 A1* | 3/2016 | Jitaru | ................. | H02M 3/3353 363/21.03 |
| 2016/0181927 A1* | 6/2016 | Chang | ................... | H02M 1/42 363/21.02 |
| 2016/0226389 A1* | 8/2016 | Quaglino | .......... | H02M 3/33592 |
| 2016/0294297 A1* | 10/2016 | Fei | ................... | H02M 3/33546 |
| 2016/0294298 A1* | 10/2016 | Wong | ................. | H02M 3/33592 |
| 2016/0294299 A1* | 10/2016 | Fan | ................... | H02M 3/33592 |
| 2016/0336867 A1* | 11/2016 | Nystrom | ........... | H02M 3/33592 |
| 2017/0040904 A1* | 2/2017 | Kikuchi | ................. | H02M 1/08 |
| 2017/0063246 A1* | 3/2017 | Kong | ................. | H02M 3/33592 |
| 2017/0155335 A1* | 6/2017 | Chang | ................... | H02M 1/08 |
| 2017/0214322 A1* | 7/2017 | Lin | ................... | H02M 3/33576 |
| 2017/0279363 A1* | 9/2017 | Hagino | ............. | H02M 3/33523 |
| 2018/0006569 A1* | 1/2018 | Kikuchi | ............ | H02M 3/33592 |
| 2018/0040540 A1* | 2/2018 | Kasuya | ...................... | H02P 6/14 |
| 2018/0047649 A1* | 2/2018 | Bando | ................... | H01L 23/053 |
| 2018/0152113 A1* | 5/2018 | Xu | ................... | H01L 23/49531 |
| 2018/0175737 A1* | 6/2018 | Kikuchi | ............ | H02M 3/33523 |

\* cited by examiner

RECTIFIER IC AND ISOLATED SWITCHING POWER SUPPLY USING SAME

CROSS-REFERENCE TO RELATED APPLICATIONS

This application is based on the corresponding Japanese Patent Application Nos. 2017-000385 filed on Jan. 5, 2017 and 2017-213914 filed on Nov. 6, 2017, the entire contents of which are incorporated herein by reference.

BACKGROUND OF THE INVENTION

Field of the Invention

The invention disclosed in the present specification relates to a rectifier IC and an isolated switching power supply using such a rectifier IC.

Description of Related Art

Conventionally, isolated switching power supplies are used in various fields (such as an automotive field, an industrial machinery field and a consumer field).

As an example of conventional technologies related thereto, Japanese Unexamined Patent Publication No. 2008-067443 can be mentioned.

FIG. 12 is a circuit block diagram showing a first conventional example of the isolated switching power supply. In the isolated switching power supply 100 of this conventional example, while a primary circuit system 100$p$ (GND1 system) and a secondary circuit system 100$s$ (GND2 system) are being electrically isolated, a direct current output voltage Vo is generated from a direct current input voltage Vi, and thus the direct current output voltage Vo can be supplied to a load Z.

However, in the isolated switching power supply 100 of the first conventional example, as a secondary-side rectification means 150, diodes 151 and 152 are used in which a forward drop voltage Vf is high, and thus there is room for further improvement in the conversion efficiency thereof.

FIG. 13 is a circuit block diagram showing a second conventional example of the isolated switching power supply. In the isolated switching power supply 200 of the second conventional example, as a secondary-side rectification means 250, instead of the diodes 151 and 152 described above, rectifier transistors 251 and 252 in which an on-resistance value is low and a control IC 253 which performs on/off control thereon are used, with the result that as compared with the first conventional example, high conversion efficiency can be realized.

However, in the isolated switching power supply 200 of the second conventional example, each time the optimum rectifier transistors 251 and 252 are selected so as to meet the specifications of an application which is installed therein, a user himself needs to perform a matching operation (such as an operation of adjusting a gate resistance value) for the controller IC 252, with the result that there is room for further improvement in the convenience thereof. Moreover, the number of components is increased as compared with the first conventional example, and thus the circuit area and the cost thereof are disadvantageously increased.

SUMMARY OF THE INVENTION

In view of the foregoing problems found by the inventor of the present application, the invention disclosed in the present specification has an object to provide a rectifier IC which can easily enhance the conversion efficiency of an isolated switching power supply.

Hence, a rectifier IC disclosed in the present specification seals, in a single package, a first transistor chip which integrates a first transistor, a second transistor chip which integrates a second transistor and a controller chip which detects a first node voltage and a second node voltage of each of the transistors so as to perform on/off control on the transistors, and the rectifier IC functions as a secondary-side rectification means of an isolated switching power supply.

Other features, elements, steps, advantages and characteristics of the present invention will become more obvious from the following detailed description of preferred embodiments and accompanying drawings related thereto.

DETAILED DESCRIPTION OF THE PREFERRED EMBODIMENTS

<Isolated Switching Power Supply>

Figure 1:
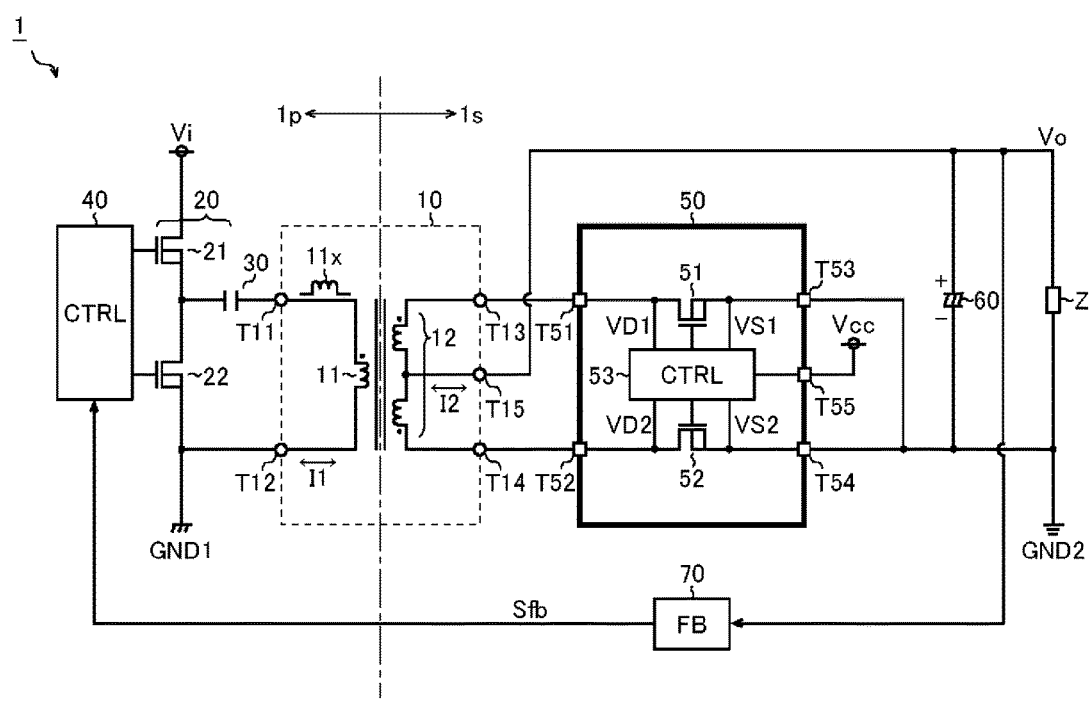
FIG. 1 is a circuit diagram showing the entire configuration of an isolated switching power supply.

FIG. 1 is a circuit diagram showing the entire configuration of an isolated switching power supply. The isolated switching power supply 1 of this figure is an LLC resonant-type DC/DC converter in which while a primary circuit system 1$p$ (GND1 system) and a secondary circuit system 1$s$ (GND2 system) are being electrically isolated, a direct current output voltage Vo is generated from a direct current input voltage Vi, and thus the direct current output voltage Vo is supplied to a load Z. The isolated switching power supply 1 includes a transformer 10, a switching circuit 20, a resonant capacitor 30, a power supply control IC 40, a rectifier IC 50, a smoothing capacitor 60 and an output feedback portion 70.

Preferably, when the isolated switching power supply 1 is used as an AC/DC converter, a preceding-stage circuit (such as a diode bridge or a power factor improvement circuit) is additionally provided which rectifies and smoothes an alternating current input voltage Vac so as to generate the direct current input voltage Vi.

The transformer 10 includes a primary winding 11 which is provided in the primary circuit system 1p and a secondary winding 12 which is provided in the secondary circuit system 1s and which is magnetically coupled to the primary winding 11.

The first tap T11 of the primary winding 11 is connected to the first end of the resonant capacitor 30. The second end of the resonant capacitor 30 is connected to the output end (=a connection node between a switching element 21 and a switching element 22 which will be described later) of the switching circuit 20. The second tap T12 of the primary winding 11 is connected to the ground end GND1 of the primary circuit system 1p.

The first tap T13 and the second tap T14 of the secondary winding 12 are connected through the rectifier IC 50 to the ground end GND2 (=a low potential end of the load Z) of the secondary circuit system 1s. On the other hand, the center tap T15 of the secondary winding 12 is connected to the output end (=a high potential end of the load Z) of the direct current output voltage Vo.

In particular, in the isolated switching power supply 1 of this configuration example, as the transformer 10, a leakage transformer or a resonant transformer is used which has a leakage inductance 11x. For convenience of illustration, this figure is shown with the assumption that the side of the first tap T11 in the primary winding 11 is accompanied with the leakage inductance 11x.

The switching circuit 20 includes the switching elements 21 and 22 (in the example of this figure, both of them are NMOSFETs) which are connected in series between the application end of the direct current input voltage Vi and the ground end GND1 of the primary circuit system 1p, and they are turned on and off so as to drive a primary current I1 flowing through the primary winding 11 of the transformer 10. The switching elements 21 and 22 may be incorporated as integrated elements in power supply control IC 40 or may be externally attached as discrete elements to the power supply control IC 40.

The resonant capacitor 30 forms an LLC resonant circuit together with the primary winding 11 of the transformer 10 and the leakage inductance 11x. Hence, even when as the transformer 10, the leakage transformer or the resonant transformer is used, and thus excess energy which is not supplied from the primary winding 11 to the secondary winding 12 is produced, the energy can be regenerated and utilized, with the result that the conversion efficiency of the isolated switching power supply 1 is prevented from being lowered.

The power supply control IC 40 performs on/off control on the switching elements 21 and 22 according to a feedback signal Sfb. The term "complementary" in the present specification includes not only a case where the on and off of the switching elements 21 and 22 are completely reversed but also a case where the on/off transition timing of the switching elements 21 and 22 is delayed (a case where a so-called simultaneous off period (dead time) is provided). For output feedback control by the power supply control IC 40, an existing known technology (such as a voltage mode control method, a current mode control method or a hysteresis control method) can be applied, and thus the detailed description thereof will be omitted.

The rectifier IC 50 is a multichip-type semiconductor integrated circuit device which functions as a secondary-side rectification means of the isolated switching power supply 1.

The configuration and the operation of the rectifier IC 50 will be described in detail later.

The smoothing capacitor 60 is connected in parallel to the load Z, and functions as a secondary-side smoothing means of the isolated switching power supply 1.

The output feedback portion 70 generates the feedback signal Sfb according to the direct current output voltage Vo. Although the circuit configuration of the output feedback portion 70 is arbitrary, a configuration using a shunt regulator and a photocoupler, a configuration using an auxiliary winding of the transformer 10 or the like is generally used.

In the isolated switching power supply 1 of this configuration example, while the primary current I1 is being passed through a first current path (Vi→21→30→11x→11→GND1) by turning on the switching element 21 and turning off the switching element 22, the switching element 21 is turned off, with the result that the primary winding 11 and the leakage inductance 11x attempt to hold the primary current I1. Here, the primary current I1 is passed through a second current path (22D→30→11x→11→22D) via the parasitic diode 22D (unillustrated) of the switching element 22, and thus almost no voltage is applied between both ends of the switching element 22. Hence, during a period in which this state is maintained, the switching element 22 is turned on, and thus it is possible to dramatically reduce a switching loss and a switching noise which are produced in the switching circuit 20.

<Rectifier IC>

The configuration and the operation of the rectifier IC 50 will then be described with reference to FIG. 1. The rectifier IC 50 of this configuration example is a multichip-type semiconductor integrated circuit device which is formed by sealing transistor chips 51 and 52 and a controller chip 53 in a single package.

The rectifier IC 50 includes, as a means for establishing an electrical connection to the outside of the IC, external terminals T51 to T55. Outside the rectifier IC 50, the external terminal T51 (which corresponds to a first drain terminal) and the external terminal T52 (which corresponds to a second drain terminal) are respectively connected to the first tap T13 and the second tap T14 in the secondary winding 12. On the other hand, both the external terminal T53 (which corresponds to a first source terminal) and the external terminal T54 (which corresponds to a second source terminal) are connected to the ground end GND2 of the secondary circuit system 1s, and also function as a ground terminal (=reference potential terminal) of the rectifier IC 50. The external terminal T55 (which corresponds to a power supply terminal) is connected to the application end of a power supply voltage Vcc.

Each of the transistor chips 51 and 52 is a semiconductor chip which is obtained by integrating a rectifier transistor (for example, a vertical NDMOSFET (N-channel type double-diffused metal oxide semiconductor field effect transistor) the details of which will be described later), and can be interpreted to be the rectifier transistor itself. Hence, in the following description, the transistor chips 51 and 52 may be referred to as the "rectifier transistors 51 and 52".

The drain of the rectifier transistor 51 is connected to the external terminal T51 and the first drain voltage detection pad of the controller chip 53. The source of the rectifier transistor 51 is connected to the external terminal T53 and the first source voltage detection pad of the controller chip 53. The gate of the rectifier transistor 51 is connected to the first gate control pad of the controller chip 53.

The drain of the rectifier transistor 52 is connected to the external terminal T52 and the second drain voltage detection pad of the controller chip 53. The source of the rectifier transistor 52 is connected to the external terminal T54 and the second source voltage detection pad of the controller chip 53. The gate of the rectifier transistor 52 is connected to the second gate control pad of the controller chip 53.

The controller chip 53 receives the supply of the power supply voltage Vcc (>GND 2) from the external terminal T55 so as to operate, and detects the drain voltage VD1 and the source voltage VS1 of the rectifier transistor 51 and the drain voltage VD2 and the source voltage VS2 of the rectifier transistor 52 so as to perform on/off control on the rectifier transistors 51 and 52.

Figure 12:
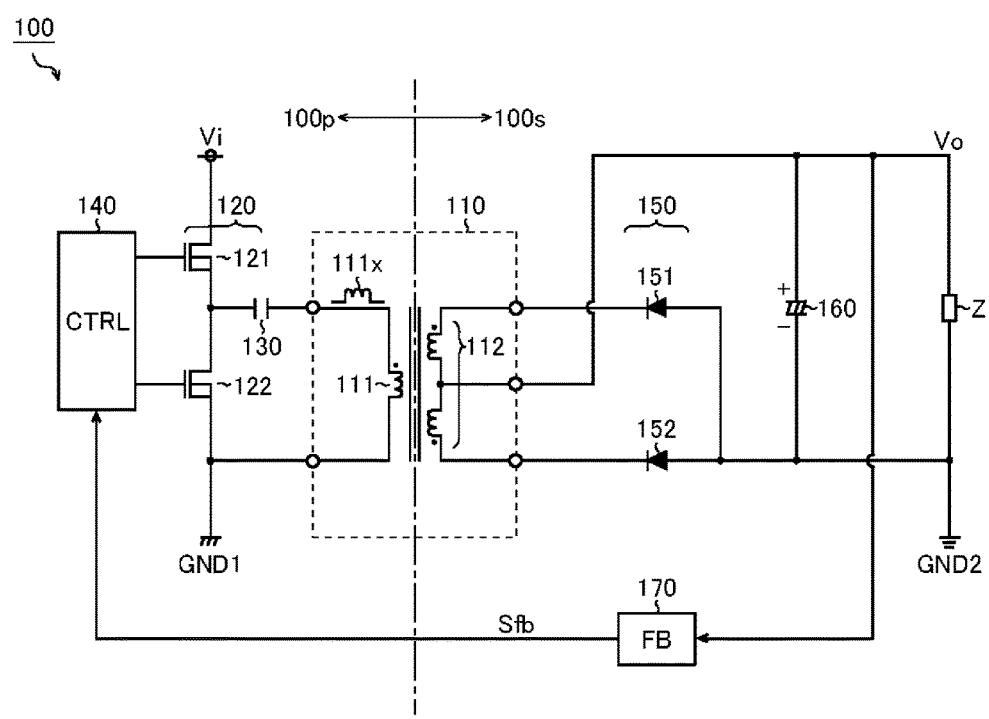
FIG. 12 is a circuit block diagram showing a first conventional example of the isolated switching power supply.

Specifically, the controller chip 53 performs gate control on the rectifier transistor 51 such that when the drain voltage VD1 is lower than the source voltage VS1 (which corresponds to the forward bias of the diode 151 in FIG. 12), the controller chip 53 turns on the rectifier transistor 51 whereas when the drain voltage VD1 is higher than the source voltage VS1 (which corresponds to the reverse bias of the diode 151), the controller chip 53 turns off the rectifier transistor 51.

Likewise, the controller chip 53 performs gate control on the rectifier transistor 52 such that when the drain voltage VD2 is lower than the source voltage VS2 (which corresponds to the forward bias of the diode 152 in FIG. 12), the controller chip 53 turns on the rectifier transistor 52 whereas when the drain voltage VD2 is higher than the source voltage VS2 (which corresponds to the reverse bias of the diode 152), the controller chip 53 turns off the rectifier transistor 52.

When the rectifier transistor 51 is turned on, and the rectifier transistor 52 is turned off, a second current I2 is passed through a current path of Vo→T15→I2→T13→T51→51→T53→GND2. On the other hand, when the rectifier transistor 51 is turned off, and the rectifier transistor 52 is turned on, the second current I2 is passed through a current path of Vo→T15→I2→T14→T52→52→T54→GND2.

As described above, in the rectifier IC 50 of this configuration example, as the secondary-side rectification means, the rectifier transistors 51 and 52 in which an on-resistance value is low are used, and thus as compared with a conventional configuration (FIG. 12) in which rectifier diodes are used, it is possible to enhance the conversion efficiency of the isolated switching power supply 1.

In the rectifier IC 50 of this configuration example, a matching operation (such as an operation of adjusting a gate resistance value) for the transistor chips 51 and 52 and the controller chip 53 can be performed on the side of a vendor. Hence, the user only needs to select the optimum rectifier IC 50 so as to meet the specifications of an application which is installed in the isolated switching power supply 1, and thus the user uses it very easily.

Figure 13:
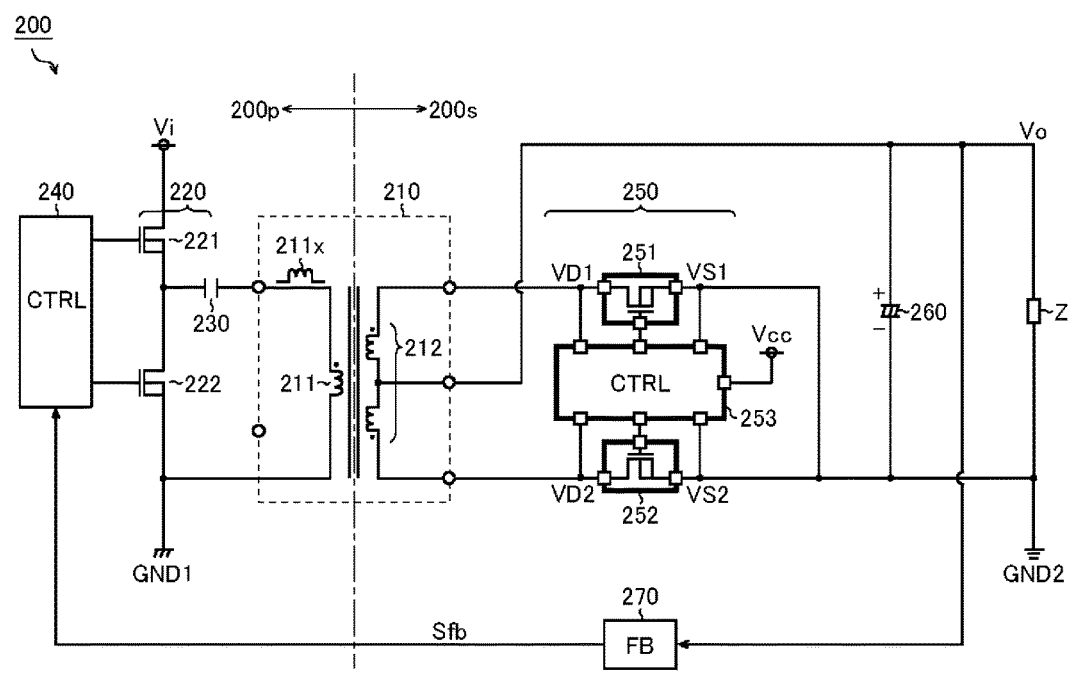
FIG. 13 is a circuit block diagram showing a second conventional example of the isolated switching power supply.

In the rectifier IC 50 of this configuration example, as compared with a conventional configuration (FIG. 13) in which discrete rectifier transistors and a controller IC are used, the number of components is reduced, and thus it is possible to reduce the circuit area and the cost thereof. It is also easy to design an element layout and a wiring pattern on a mother board.

<Transistor Chip>

Figure 2:
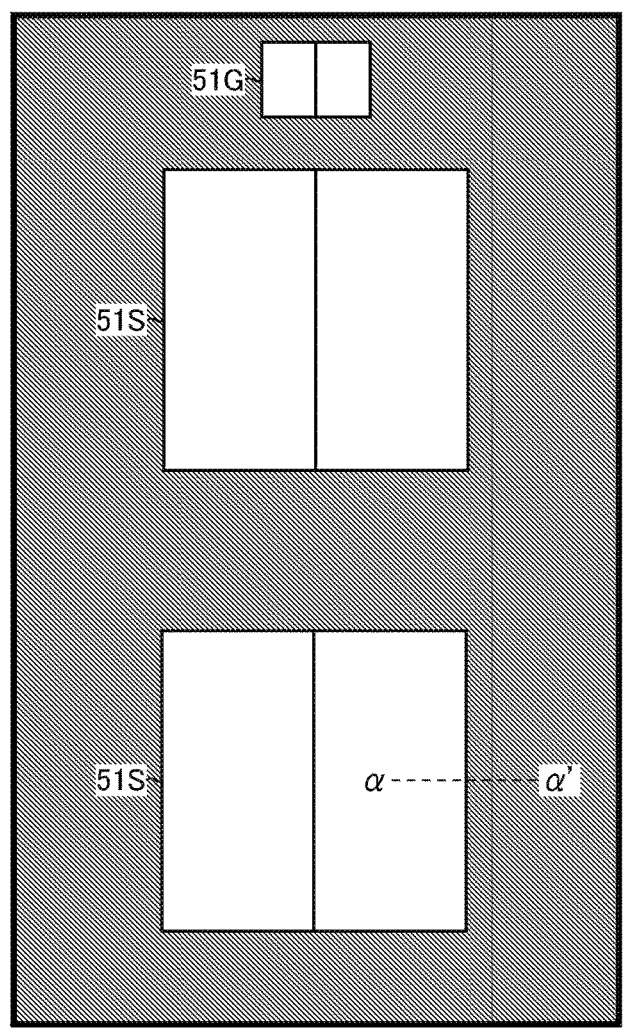
FIG. 2 is a plan view of a transistor chip.
Figure 3:
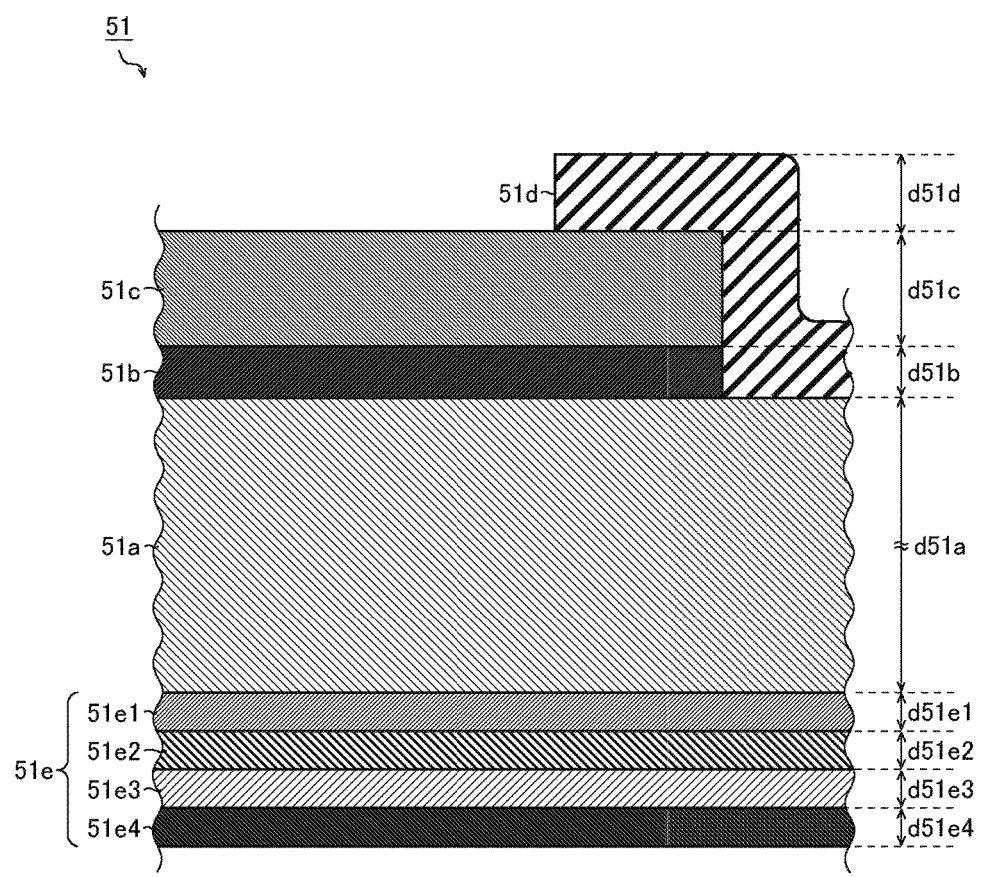
FIG. 3 is a cross-sectional view taken along line α-α' in the transistor chip.

FIGS. 2 and 3 are respectively a plan view of the transistor chip 51 and a cross-sectional view taken along line α-α'. The rectifier transistor which is integrated in the transistor chip 51 (for example, 3 mm×3 mm including a scribe with of 90 μm) is the vertical NDMOSFET, and on the side of the front surface thereof, as shown in FIG. 2, two source pads 51S (for example, 2400 μm×900 μm) and one gate pad 51G (for example, 480 μm×320 μm) are formed. The number, the size and the arrangement layout of each of the source pads 51S and the gate pad 51G can be adjusted as necessary according to the current capability of the rectifier transistor, manufacturing process rules and the like.

As shown in FIG. 3, in the transistor chip 51, a cell portion 51a (thickness d51a=various values such as 270 μm and 150 μm) is formed in its silicon substrate. A large number of unit cells are included in the cell portion 51a, and they are connected in parallel to each other so as to form one rectifier transistor. As the structure of the unit cell, a trench gate type may be adopted or a planar gate type may be adopted. In particular, when the trench gate type is adopted, it is possible to reduce the size of the unit cell, and thus it is possible to realize a low on-resistance of the rectifier transistor.

On the front surface of the cell portion 51a, an intermediate insulating layer 51b (for example, an $SiO_2$ layer) is formed so as to cover the gates of the unit cells.

On the front surface of the intermediate insulating layer 51b, a metal layer 51c (which corresponds to the source pad 51S and whose thickness d51c is 4.2 μm) that is rectangular in plan view is formed. As the material of the metal layer 51c, for example, an AlCu based alloy can be preferably used.

Around the intermediate insulating layer 51b and the metal layer 51c, a protective layer 51d (thickness d51d=1.6 μm) is formed so as to cover them up to the front surface outer peripheral portion of the metal layer 51c. In other words, the protective layer 51d covers the front surface of the transistor chip 51 such that the source pads 51S (and the gate pad 51G) are exposed when the transistor chip 51 is seen in plan view (see the hatched region of FIG. 2). As the material of the protective layer 51d, for example, SiN can be preferably used.

On the other hand, on the back surface of the cell portion 51a, a drain electrode 51e is solid wired. The drain electrode 51e has a multilayer structure in which a Ti layer 51e1, a Ni layer 51e2, an Au layer 51e3 and an Ag layer 51e4 are stacked in layers sequentially from the side of the cell portion 51a, and the Ag layer 51e4 which is the outermost layer is die bonded to lead frames with silver paste or solder. The thicknesses d51e1 to d51e4 of the layers are, for example, 70, 600, 70 and 300 nm.

The transistor chips 51 and 52 have the same structure. Hence, when in the above description on the transistor chip 51, the number in the one's place of the reference numeral is changed from "1" to "2", the above description can be understood as the description on the transistor chip 52.

Lead Frames (First Pattern Example)

Figure 4:
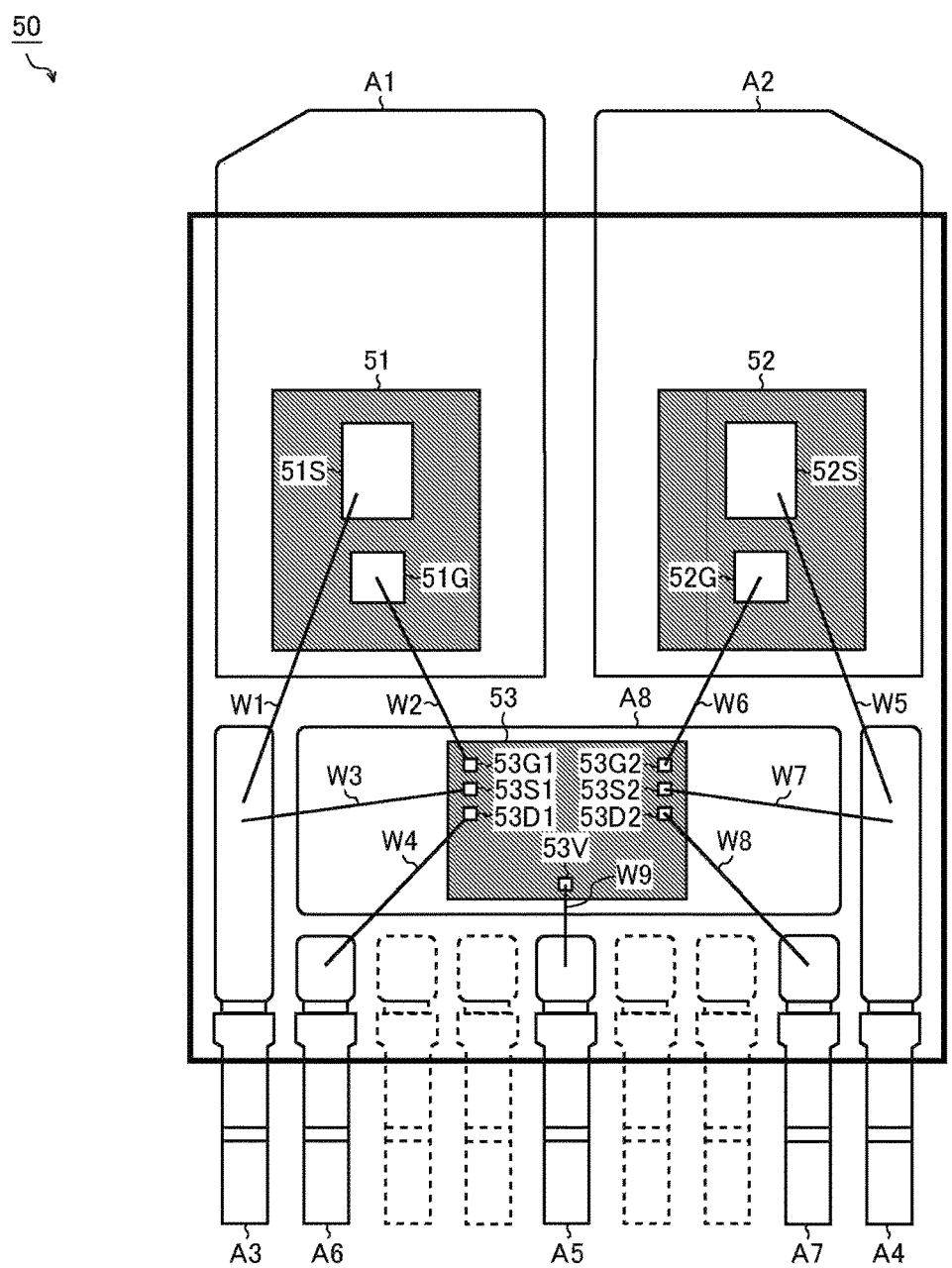
FIG. 4 is a plan transparent view showing a first pattern example of lead frames.

FIG. 4 is a plan transparent view (an example of the adoption of a power package) showing a first pattern example of lead frames in the rectifier IC 50. As shown in this figure, the rectifier IC 50 includes the lead frames A1 to A7 and a die pad A8.

The lead frames A1 and A2 are extended out from the first end surface of the package in a first direction (=upward in the plane of the figure) as the external terminals T51 and T52 described previously. The lead frames A1 and A2 are wider in width than the lead frames A3 to A7, and are exposed from the package as lead pins which also serve as heat dissipation pads (the details of which will be described later).

The lead frames A3 to A7 are extended out from the second end surface (=the end surface on the side opposite to the first end surface) of the package in a second direction (=downward in the plane of the figure). The lead frames A3 to A5 respectively correspond to the external terminals T53 to T55 described previously. The lead frames A6 and A7 are respectively monitor terminals for the drain voltages VD1 and VD2, and are respectively connected to the lead frames A1 and A2 in the outside of the rectifier IC 50.

When an additional function is provided to the rectifier IC 50, as indicated by broken lines in the figure, a lead frame can be additionally provided.

The back surface (=the drain electrode) of the transistor chip 51 is die bonded to the lead frame A1. Likewise, the back surface (=the drain electrode) of the transistor chip 52 is die bonded to the lead frame A2. The lead frames A1 and A2 are preferably patterned so as to have the largest possible area within the range of the package. In this configuration, heat which is generated in the transistor chips 51 and 52 can be dissipated efficiently.

On the other hand, the controller chip 53 is die bonded to the die pad A8 which is physically separated from the lead frames A1 and A2. In this configuration, head and noise are unlikely to be propagated from the transistor chips 51 and 52 to the controller chip 53, and thus it is possible to enhance the reliability of the rectifier IC 50.

One or a plurality of wires W1 to W4 are individually provided between the source pad 51S of the transistor chip 51 and the lead frame A3, between the gate pad 51G of the transistor chip 51 and the first gate control pad 52G1 of the controller chip 53, between the first source voltage detection pad 53S1 of the controller chip 53 and the lead frame A3 and between the first drain voltage detection pad 53D1 of the controller chip 53 and the lead frame A6.

One or a plurality of wires W5 to W8 are individually provided between the source pad 52S of the transistor chip 52 and the lead frame A4, between the gate pad 52G of the transistor chip 52 and the second gate control pad 52G2 of the controller chip 53, between the second source voltage detection pad 53S2 of the controller chip 53 and the lead frame A4 and between the second drain voltage detection pad 53D2 of the controller chip 53 and the lead frame A7.

Furthermore, one or a plurality of wires W9 are provided between the power supply pad 53V of the controller chip 53 and the lead frame A5. As the material of the wires W1 to W9, Cu and Al are preferably used.

<Package>

Figure 5:
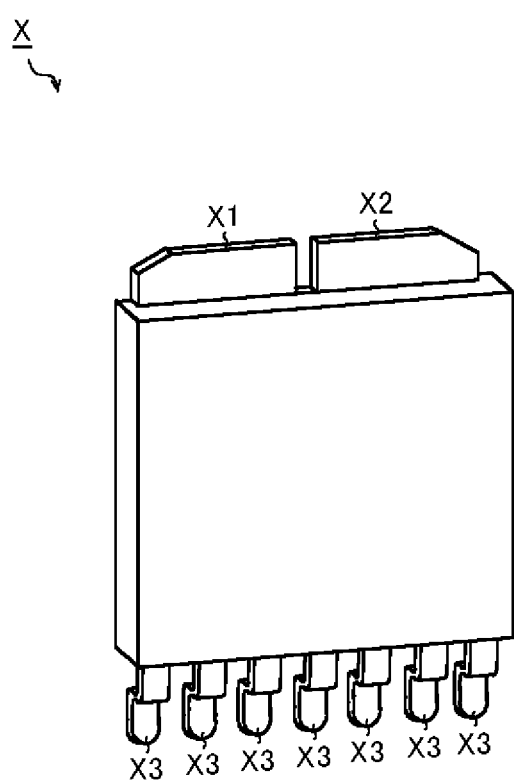
FIG. 5 is a perspective view of the side of the front surface of a power package.
Figure 6:
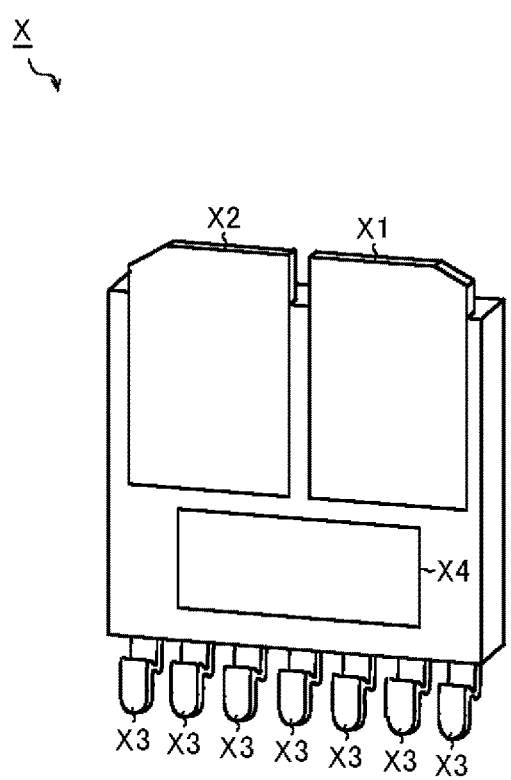
FIG. 6 is a perspective view of the side of the back surface of the power package.

FIGS. 5 and 6 are respectively perspective views (the side of the front surface and the side of the back surface) of the power package. In the power package X, two lead pins X1 and X2 which also serve as heat dissipation pads are extended out from the first end surface in the first direction (=upward in the plane of the figure), and seven lead pins X3 are extended out from the second end surface (=the end surface on the side opposite to the first end surface) in the second direction (=downward in the plane of the figure).

The lead pins X1 and X2 which also serve as heat dissipation pads respectively correspond to the lead frames A1 and A2 (FIG. 4) described previously on which the transistor chips 51 and 52 are mounted, and are provided to be flush with the back surface of the power package X such that at least parts thereof are exposed on the side of the back surface of the power package X. In this configuration, it is possible to enhance the heat dissipation of the transistor chips 51 and 52, and thus thermal destruction and thermal runaway are unlikely to occur in the rectifier IC 50. The lead pins X1 and X2 which also serve as heat dissipation pads are wider in width than the lead pins X3, and the extending end corner portions thereof (=the corner portions which are not adjacent to each other and which are directed outward) are chamfered.

At least part of the die pad A8 (FIG. 4) on which the controller chip 53 is mounted is preferably exposed as a heat dissipation pad X4 from the back surface of the power package X. In this configuration, it is possible to enhance not only the heat dissipation (hence, the operation stability) of the transistor chips 51 and 52 which are heat generation sources but also the heat dissipation (hence, the operation stability) of the controller chip 53 which is easily affected by heat.

Naturally, in the rectifier transistors 51 and 52, as described previously, the on-resistance value thereof is low, and as compared with the conventional configuration in which rectifier diodes are used, only a small amount of power loss is produced therein. Hence, depending on current flowing through the transistor chips 51 and 52, the heat dissipation of the transistor chips 51 and 52 is not significantly problematic, and thus it may be unnecessary to enhance the heat dissipation effect by exposing the lead frames A1 and A2 (or the die pad A8) from the package. In that case, a normal package in which the exposure on the back surface is not performed can also be used.

On the other hand, the lead pins X3 correspond to the lead frames A3 to A7 (FIG. 4) described previously, and are bend so as to be flush with the lead pins X1 and X2 which also serve as heat dissipation pads on the side of the back surface of the power package X.

Lead Frames (Second Pattern Example)

Figure 7:
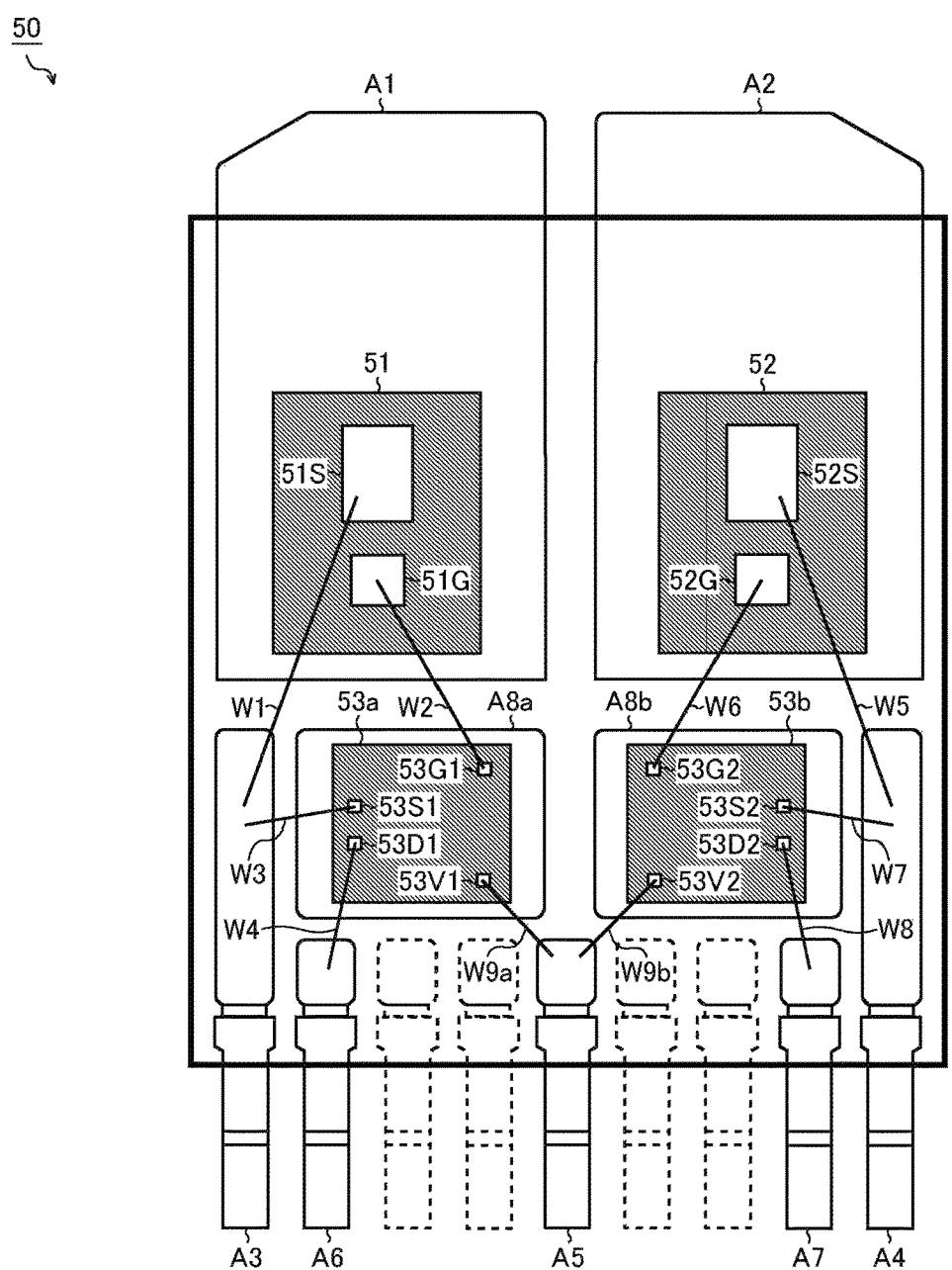
FIG. 7 is a plan transparent view showing a second pattern example of the lead frames.

FIG. 7 is a plan transparent view showing a second pattern example of the lead frames in the rectifier IC 50. The rectifier IC 50 of the second pattern example is based on the first pattern example (FIG. 4) described previously, and instead of the controller chip 53 which performs on/off control on both the rectifier transistors 51 and 52, the rectifier IC 50 individually includes a controller chip 53a which performs on/off control on the rectifier transistor 51 and a controller chip 53b which performs on/off control on the transistor chip 52.

Since the controller chips 53a and 53b are independently separated, the rectifier IC 50 individually includes, instead of the die pad A8, a die pad A8a to which the controller chip 53a is die bonded and a die pad A8b to which the controller chip 53b is die bonded.

One or a plurality of wires W9a and W9b are individually provided between the power supply pads 53V1 and 53V2 of the controller chips 53a and 53b and the lead frame A5.

In this configuration, the die pads A8a and A8b can be electrically separated, and thus the ground potentials (=reference potentials) of the controller chips 53a and 53b can be set individually and independently. In other words, the ground terminals (=the external terminals T53 and T54) of the rectifier IC 50 do not need to be connected to a common potential end, and thus it is possible to extend the scope of applications of the rectifier IC 50.

An isolated switching power supply 1 to which the rectifier IC 50 of the second pattern example is applied will be described in detail below.

<Isolated Switching Power Supply (Variations)>

Figure 8:
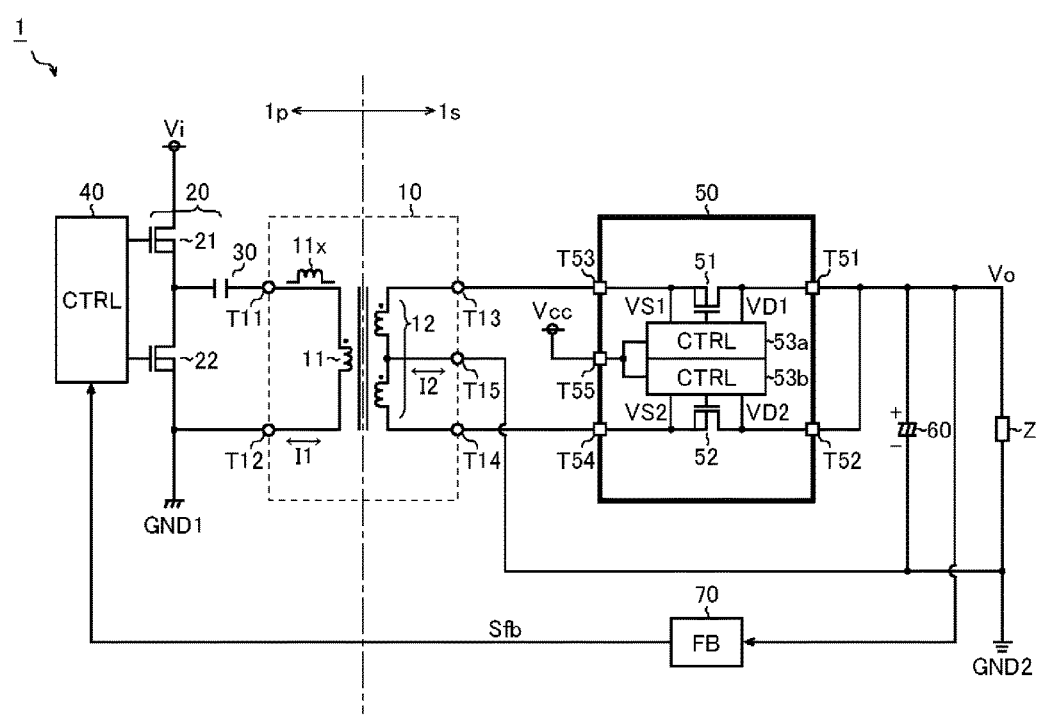
FIG. 8 is a circuit block diagram showing a first variation of the isolated switching power supply.

FIG. 8 is a circuit block diagram showing a first variation of the isolated switching power supply. In the isolated switching power supply 1 of the present variation, the rectifier IC 50 of the second pattern example (FIG. 7) is applied, and thus the secondary circuit system 1s is changed from a low-side type (FIG. 1) to a high-side type. In the following discussion, while attention is focused on a connection relationship around the rectifier IC 50, differences between the low-side type (FIG. 1) and the high-side type (FIG. 8) will be described.

Outside the rectifier IC 50, the external terminal T53 (which corresponds to the first source terminal) and the external terminal T54 (which corresponds to the second source terminal) are respectively connected to the first tap T13 and the second tap T14 of the secondary winding 12. The external terminals T53 and T54 also function as the ground terminals (=the reference potential terminals) of the controller chips 53a and 53b, respectively. The center tap T15 of the secondary winding 12 is connected to the ground end GND2 (=the low potential end of the load Z) of the secondary circuit system 1s.

On the other hand, the external terminal T51 (which corresponds to the first drain terminal) and the external terminal T52 (which corresponds to the second drain terminal) are connected to the output end (=the high potential end of the load Z) of the direct current output voltage Vo. As in FIG. 1, the external terminal T55 (which corresponds to the power supply terminal) is connected to the application end of the power supply voltage Vcc.

In a case where the secondary circuit system 1s is the high-side type, when the rectifier transistor 51 is turned on, and the rectifier transistor 52 is turned off, the second current I2 is passed through a current path of 12→T13→T53→51→T51→Vo→Z→GND2. On the other hand, when the rectifier transistor 51 is turned off, and the rectifier transistor 52 is turned on, the second current I2 is passed through a current path of 12→T14→T54→52→T52→Vo→Z→GND2.

As described above, the rectifier IC 50 of the second pattern example (FIG. 7) is applied, and thus in the LLC resonant-type isolated switching power supply 1, the secondary circuit system 1s can be changed from the low-side type (FIG. 1) to the high-side type (FIG. 8).

Figure 9:
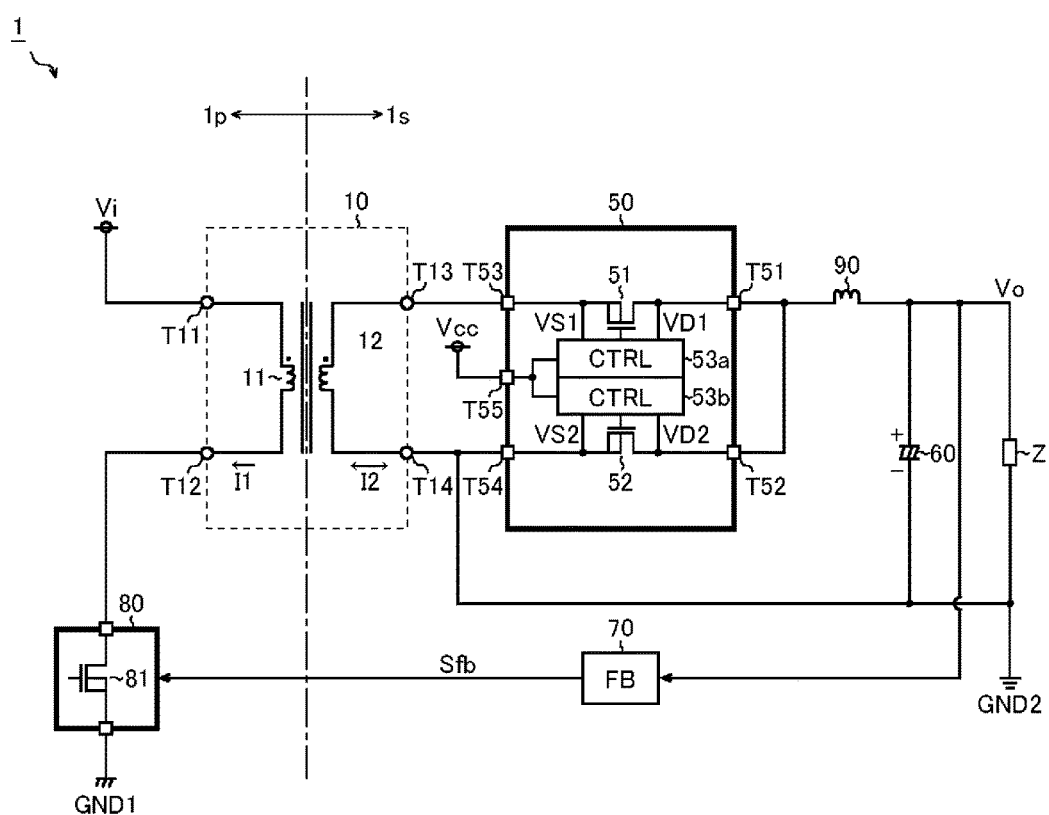
FIG. 9 is a circuit block diagram showing a second variation of the isolated switching power supply.

FIG. 9 is a circuit block diagram showing a second variation of the isolated switching power supply. In the isolated switching power supply 1 of the present variation, the rectifier IC 50 of the second pattern example (FIG. 7) is applied, and thus the primary circuit system 1p and the secondary circuit system 1s are changed from the LLC resonant type (FIG. 1) to a forward type.

In the primary circuit system 1p, the first tap T11 of the primary winding 11 is connected to the input end of the direct current input voltage Vi. The second tap T12 of the primary winding 11 is connected to the ground end GND1 of the primary circuit system 1p through an output transistor 81 (which is incorporated in a power supply control IC 80 in the example of this figure,). The first tap T13 and the second tap T14 of the secondary winding 12 are connected through the rectifier IC 50 to the output end (=the high potential end of the load Z) of the output voltage Vo. The second tap T14 of the secondary winding 12 is also connected to the ground end GND2 (=the low potential end of the load Z) of the secondary circuit system 1s.

The power supply control IC 80 turns on and off the output transistor 81 according to the feedback signal Sfb so as to control the primary current I1 flowing through the primary winding 11 of the transformer 10. The output transistor 81 may be incorporated as an integrated element in the power supply control IC 80 or may be externally attached as a discrete element to the power supply control IC 80. For output feedback control by the power supply control IC 80, the existing known technology (such as the voltage mode control method, the current mode control method or the hysteresis control method) can be applied, and thus the detailed description thereof will be omitted.

The connection relationship around the rectifier IC 50 will then be described. The external terminal T53 (which corresponds to the first source terminal) and the external terminal T54 (which corresponds to the second source terminal) are respectively connected to the first tap T13 and the second tap T14 of the secondary winding 12. The external terminals T53 and T54 also function as the ground terminals (=the reference potential terminals) of the controller chips 53a and 53b, respectively.

On the other hand, the external terminal T51 (which corresponds to the first drain terminal) and the external terminal T52 (which corresponds to the second drain terminal) are connected through an inductor 90 (=choke coil) to the output end (=the high potential end of the load Z) of the direct current output voltage Vo. As in FIG. 1, the external terminal T55 (which corresponds to the power supply terminal) is connected to the application end of the power supply voltage Vcc.

In the forward-type isolated switching power supply 1, when the rectifier transistor 51 is turned on, and the rectifier transistor 52 is turned off, the second current I2 is passed through a current path of 12→T13→T53→51→T51→90→Vo→Z→GND2. On the other hand, when the rectifier transistor 51 is turned off, and the rectifier transistor 52 is turned on, the second current I2 is passed through a current path of 12→T14→T54→52→T52→90→Vo→Z→GND2 by energy stored in an inductor L1.

As described above, the rectifier IC 50 of the second pattern example (FIG. 7) is applied, and thus the isolated switching power supply 1 can also be changed from the LLC resonant type (FIG. 1 or FIG. 8) to the forward type (FIG. 9).

Lead Frames (Third Pattern Example)

Figure 10:
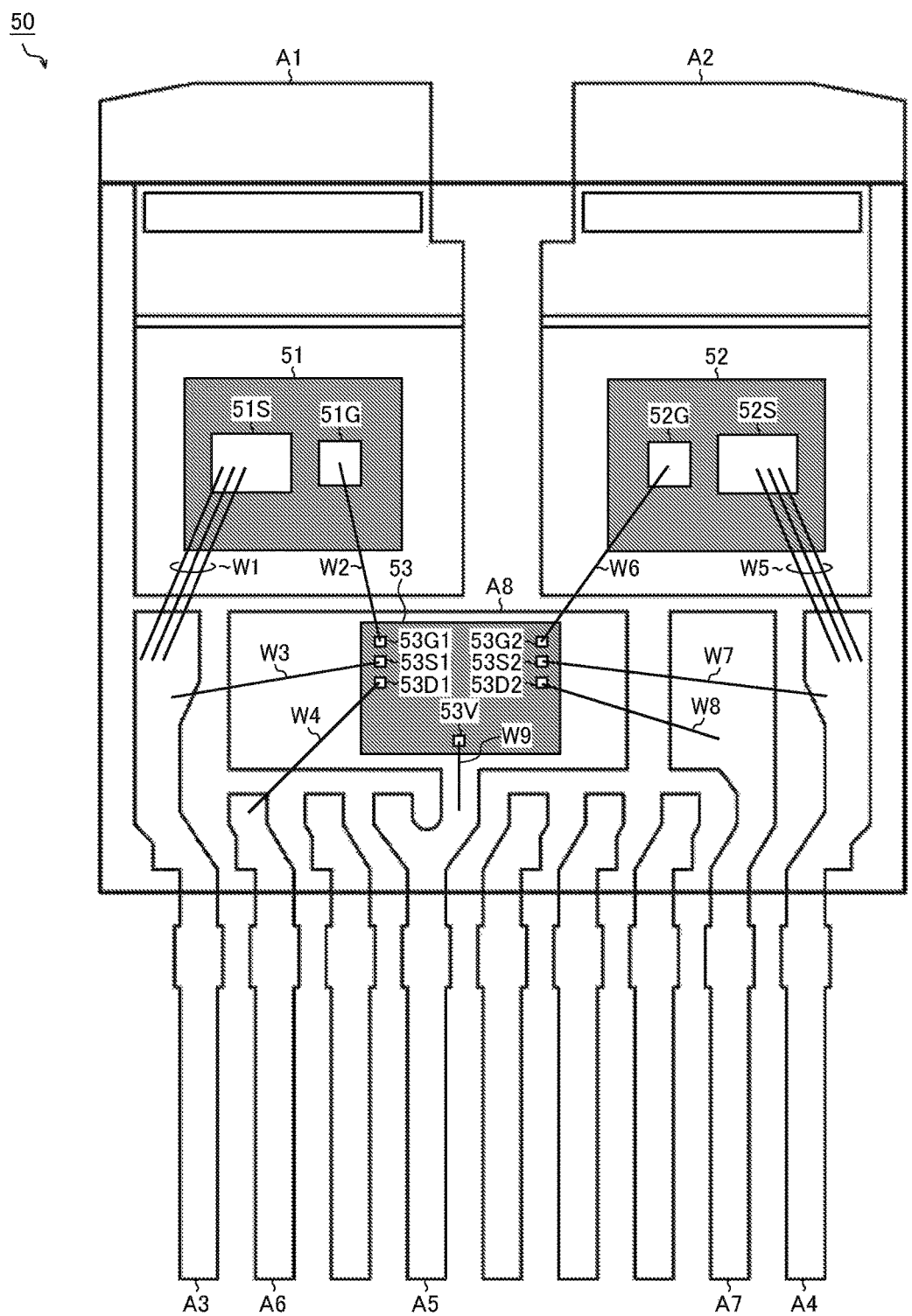
FIG. 10 is a plan transparent view showing a third pattern example of the lead frames.

FIG. 10 is a plan transparent view showing a third pattern example of the lead frames in the rectifier IC 50. The rectifier IC 50 of the third pattern example is based on the first pattern example (FIG. 4) described previously, and some changes are added. The plan transparent view of this figure is drawn according to the actual rectifier IC as compared with FIG. 4 described previously.

First, as a first change point for the first pattern example (FIG. 4), the transistor chip 51 is die bonded to the lead frame A1 in a state where the transistor chip 51 is rotated counterclockwise by 90 degrees. For the first pattern example (FIG. 4), the transistor chip 52 is die bonded to the lead frame A2 in a state where the transistor chip 52 is rotated clockwise by 90 degrees.

Then, as a second change point, a plurality of (three in the figure) wires W1 and W5 are individually provided between the source pad 51S of the transistor chip 51 and the lead frame A3 and between the source pad 52S of the transistor chip 52 and the lead frame A4.

<Transistor Chip>

Figure 11:
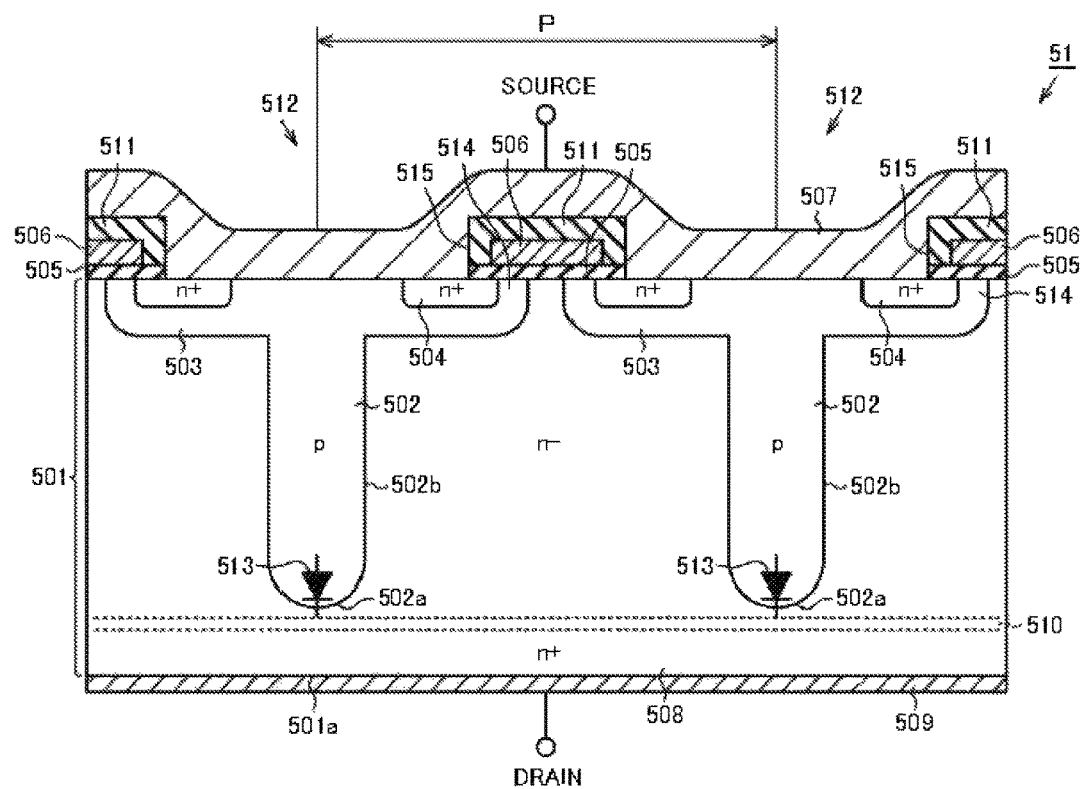
FIG. 11 is a vertical cross-sectional view of the transistor chip.

FIG. 11 is a vertical cross-sectional view of the transistor chip 51. The transistor chip 52 has the same structure as the transistor chip 51, and thus the description thereof will be omitted.

As shown in this figure, the MOSFET integrated in the transistor chip 51 has a superjunction structure. More specifically, the transistor chip 51 includes an n− type base layer 501, a p-type column layer 502, a p-type base layer 503, an n+ type source layer 504, a gate insulating film 505, a gate electrode 506, a source electrode 507, an n+ type contact layer 508, a drain electrode 509 and a trap level region 510. On the gate electrode 506, an interlayer insulating film 511 is arranged.

Here, the source electrode 507 is connected to the source pad 51S described previously. The gate electrode 506 is connected to the gate pad 51G in a state where the gate electrode 506 is insulated from the source electrode 507. The drain electrode 509 is die bonded to the lead frame A1 described previously.

The n− type base layer 501 is a semiconductor layer in which an n-type impurity is implanted. Specifically, the n− type base layer 501 is an n-type epitaxial layer which is epitaxially grown while the n-type impurity is being implanted. As the n-type impurity, P (phosphorus), As (arsenic), SB (antimony) and the like can be used.

The p-type column layer 502 and the p-type base layer 503 are semiconductor layers in which a p-type impurity is implanted. Specifically, the p-type column layer 502 and the p-type base layer 503 are semiconductor layers which are formed by ion-implanting the p-type impurity into the n− type base layer 501. As the p-type impurity, B (boron), Al (aluminum), Ga (gallium) and the like can be applied.

When the transistor chip 51 is seen in plan view (hereinafter simply referred to as "in plan view"), in a plurality of regions which are periodically and discretely arranged, the p-type base layers 503 are selectively formed in the front surface portion of an n− type base layer 81. For example, in plan view, the p-type base layers 503 of a rectangular pattern may be arranged in a staggered manner. Moreover, for example, in plan view, the p-type base layers 503 of a hexagonal pattern may be arranged in a staggered manner. Moreover, for example, in plan view, the p-type base layers 503 of a linear pattern may be arranged in a stripe shape.

A region which includes each p-type base layer 503 and the n− type base layer 501 therearound forms a cell 512. In other words, in plan view, the transistor chip 51 includes a large number of (a plurality of) cells 512 which are aligned in a lattice shape or a stripe shape. The pitch P (cell width) of the cells 512 is 5.0 to 20 μm.

The p-type column layer 502 is formed so as to be continuous with the p-type base layer 503, and in the n− type base layer 501, the p-type column layer 502 is extended to a position deeper than the p-type base layer 503 toward the back surface 501a of the n− type base layer 501. In other words, the p-type column layer 502 is formed substantially in the shape of a column or a layer. The thickness T of the n− type base layer 501 from the bottom surface 502a of the p-type column layer 502 to the back surface 501a of the n− type base layer 501 is preferably equal to or more than 15 μm. When the thickness T is equal to or more than 15 μm (T≥15 μm), it is possible to realize the voltage withstand performance of 600V or more. The side surface 502b (the interface with the n− type base layer 501) of the p-type column layer 502 is opposite the side surface 502b of another surrounding p-type column layer 502 through the n− type base layer 501.

The interface between the p-type base layer 503 and the p-type column layer 502 and the n− type base layer 501 is a pn junction surface, and forms a parasitic diode (body diode) 513.

The n+ type source layer 504 is formed, in plan view, in an inner region of the p-type base layer 503 in each cell 512. In the region, the n+ type source layer 504 is selectively formed in the front surface portion of the p-type base layer 503. The n+ type source layer 504 may be formed by selectively ion-implanting an n-type impurity into the p-type base layer 503. Examples of the n-type impurity are as described previously. The n+ type source layer 504 is formed within the p-type base layer 503 so as to be located a predetermined distance inward from the interface between the p-type base layer 503 and the n− type base layer 501. In this way, in a front layer region of the semiconductor layers including the n− type base layer 501 and the p-type base layer 503, between the n+ type source layer 504 and the n-type base layer 501, the front surface portion of the p-type base layer 503 is interposed, and the interposed front surface portion provides a channel region 514.

In plan view, the n+ type source layer 504 is formed annularly or linearly in a region outside the side surface 502b of the p-type column layer 502. The channel region 514 has, in plan view, an annular shape or a linear shape according to the shape of the n+ type source layer 504.

The gate insulating film 505 is formed so as to cover at least the front surface of the p-type base layer 503 in the channel region 514. In the example of this figure, the gate insulating film 505 is formed so as to cover the front surfaces of part of the n+ type source layer 504, the channel region 514 and the n− type base layer 501. Strictly speaking, the gate insulating film 505 is formed in a pattern in which an opening is provided in a center region of the p-type base layer 503 in each cell 512 and an inner edge region of the n+ type source layer 504 continuous with this region. The gate insulating film 505 is formed with, for example, a silicon oxide film, a silicon nitride film, a silicon oxynitride film, a hafnium oxide film, an alumina film or a tantalum oxide film.

The gate electrode 506 is formed opposite the channel region 514 through the gate insulating film 505. The gate electrode 506 is formed of, for example, polysilicon whose resistance is lowered by implanting an impurity. In the example of this figure, the gate electrode 506 is formed substantially in the same pattern as the gate insulating film 505 so as to cover the front surface of the gate insulating film 505. In other words, the gate electrode 506 is formed above the front surfaces of part of the n+ type source layer 504, the channel region 514 and the n− type base layer 501. Strictly speaking, the gate electrode 506 is formed in a pattern in which an opening is provided in the center region of the p-type base layer 503 in each cell 512 and the inner edge region of the n+ type source layer 504 continuous with this region. In other words, the gate electrode 506 is formed so as to control a plurality of cells 512 in common. In this way, a planar gate structure is formed.

The interlayer insulating film 511 is formed of, for example, an insulating material such as a silicon oxide film, a silicon nitride film or a TEOS (tetraethoxysilane). The interlayer insulating film 511 covers the upper surface and the side surface of the gate electrode 506, and is formed in a pattern in which a contact hole 515 is provided in the center region of the p-type base layer 503 in each cell 512 and the inner edge region of the n+ type source layer 504 continuous with this region.

The source electrode 507 is formed of aluminum or another metal. The source electrode 507 is formed so as to cover the front surface of the interlayer insulating film 511 and to be embedded in the contact hole 515 in each cell 512. In this way, the source electrode 507 is ohmically connected to the n+ type source layer 504. Hence, the source electrode 507 is connected in parallel to the cells 512, and is formed such that the total current flowing through the cells 512 is passed therethrough. The source electrode 507 is ohmically connected to the p-type base layer 503 in each cell 512 through the contact hole 515 so as to stabilize the potential of the p-type base layer 503.

The n+ type contact layer 508 is formed in the vicinity of the back surface 501a (the back surface portion) of the n− type base layer 501 over the entire back surface 501a. The n+ type contact layer 508 is formed at such a depth that a gap is formed with the bottom surface 502a of the p-type column layer 502. In this way, between the p-type column layer 502 and the n+ type contact layer 508, the n− type base layer 501 is interposed.

The drain electrode 509 is formed of aluminum or another metal. The drain electrode 509 is formed so as to be in contact with the n+ type contact layer 508 in the back surface 501a of the n− type base layer 501. In this way, the drain electrode 509 is connected in parallel to the cells 512, and is formed such that the total current flowing through the cells 512 is passed therethrough. In the example of this figure, in the vicinity of the back surface 501a of the n− type base layer 501, the n+ type contact layer 508 is formed, and thus the drain electrode 509 can be satisfactorily ohmically connected to the n− type base layer 501.

When a direct current power supply is connected between the source electrode 507 and the drain electrode 509 while the drain electrode 509 is a high potential side and the source electrode 507 is a low potential side, a reverse bias is applied to the parasitic diode 513. Here, when a control voltage which is lower than a predetermined threshold voltage is applied to the gate electrode 506, no current path is formed between the drain and the source. In other words, the transistor chip 51 is brought into an off-state. On the other hand, when a control voltage which is equal to or higher than the threshold voltage is applied to the gate electrode 506, electrons are attracted to the front surface of the channel region 514 so as to form an inversion layer (channel). In this way, electrical continuity is provided between the n+ type source layer 504 and the n− type base layer 501. Specifically, a current path is formed which is passed from the source electrode 507 sequentially through the n+ type source layer 504, the inversion layer of the channel region 514 and the n− type base layer 501 to the drain electrode 509. In other words, the transistor chip 51 is brought into an on-state.

As described above, the p-type column layer 502 continuous with the p-type base layer 503 is extended toward the back surface 501a of the n− type base layer 501, and thus the MOSFET of the superjunction structure is formed.

OTHER VARIATIONS

In addition to the embodiment described above, the various technical features disclosed in the present specification can be variously changed without departing from the spirit of the technical creation thereof. Specifically, it should be considered that the embodiment described above is illustrative in all respects and not restrictive, and it should be understood that the technical scope of the present invention is indicated not by the description of the embodiment discussed above but by the scope of claims, and that meanings equivalent to the scope of claims and all modifications belonging to the scope are included.

INDUSTRIAL APPLICABILITY

The invention disclosed in the present specification can be utilized for isolated switching power supplies which are used in various fields (such as an automotive field, an industrial machinery field and a consumer field).

What is claimed is:

1. A rectifier IC comprising:
a first transistor chip including a first transistor;
a second transistor chip including a second transistor;
a controller chip operable to detect a first node voltage and a second node voltage of each of the transistors so as to perform on/off control on both of the transistors;
a first lead frame on which the first transistor chip is mounted;
a second lead frame on which the second transistor chip is mounted;
a die pad on which the controller chip is mounted;
a third lead frame connected to a source of the first transistor; and
a fourth lead frame connected to a source of the second transistor,
wherein the rectifier IC functions as a secondary-side rectifier of an isolated switching power supply,
wherein the first transistor chip, the second transistor chip and the controller chip are sealed in a single package,
wherein the first and second lead frames are led out of the package at a first side thereof, and the third and fourth lead frames are led out of the package at a second side thereof, and
wherein the third and fourth lead frames are arranged at opposite ends, respectively, of the second side of the package.

2. The rectifier IC according to claim 1, wherein when the controller chip performs the on/off control on both of the transistors, wherein the controller chip turns on the transistor in which the first node voltage is lower than the second node voltage, and turns off the transistor in which the first node voltage is higher than the second node voltage.

3. The rectifier IC according to claim 1, wherein each of the transistors is a vertical NDMOSFET (N-channel type double-diffused metal oxide semiconductor field effect transistor).

4. The rectifier IC according to claim 1, wherein the first lead frame and the second lead frame are wider in width than other lead frames, and are exposed from the package as lead pins which also serve as heat dissipation pads.

5. The rectifier IC according to claim 1, wherein at least part of the die pad is exposed from the package as a heat dissipation pad.

6. The rectifier IC according to claim 1, wherein the controller chip overlaps a center of the package in a first direction in which the first and second transistor chips are aligned.

7. The rectifier IC according to claim 1, wherein the first and second transistor chips are aligned in a first direction, and the first transistor has the source and a gate formed on a first surface thereof, and the source and the gate are aligned in a second direction perpendicular to the first direction.

8. The rectifier IC according to claim 1, wherein the first and second transistor chips are aligned in a first direction, and the second transistor has the source and a gate formed on a first surface thereof, and the source and the gate are aligned in a second direction perpendicular to the first direction.

9. The rectifier IC according to claim 1,
wherein the controller chip is arranged between the third and fourth lead frames.

10. The rectifier IC according to claim 1, wherein the third and fourth lead frames are longer than any other lead frame.

11. The rectifier IC according to claim 1, wherein the first lead frame, the second lead frame, the die pad, the third lead frame and the fourth lead frame arranged away from each other.

12. The rectifier IC according to claim 1, wherein the third lead frame, the die pad and the fourth lead frame overlap each other in a first direction in which the first and second transistor chips are aligned.

13. The rectifier IC according to claim 1, further comprising:
a fifth lead frame disconnected to the controller chip.

14. The rectifier IC according to claim 13, wherein the fifth lead frame is shorter than the third and fourth lead frames.

15. An isolated switching power supply comprising:
a secondary-side rectifier of a transformer,
wherein the secondary-side rectifier includes a rectifier IC, the rectifier IC comprising:
a first transistor chip including a first transistor;
a second transistor chip including a second transistor;
a controller chip operable to detect a first node voltage and a second node voltage of each of the transistors so as to perform on/off control on both of the transistors;
a first lead frame on which the first transistor chip is mounted;
a second lead frame on which the second transistor chip is mounted;
a die pad on which the controller chip is mounted;
a third lead frame connected to a source of the first transistor; and
a fourth lead frame connected to a source of the second transistor,
wherein the first transistor chip, the second transistor chip and the controller chip are sealed in a single package,
wherein the first and second lead frames are led out of the package at a first side thereof, and the third and fourth lead frames are led out of the package at a second side thereof, and
wherein the third and fourth lead frames are arranged at opposite ends, respectively, of the second side of the package.

16. The isolated switching power supply according to claim 15, wherein the isolated switching power supply is an LLC resonant type.

17. The isolated switching power supply according to claim 15, wherein the isolated switching power supply is a forward type.

18. The isolated switching power supply according to claim 15, wherein the first lead frame, the second lead frame, the die pad, the third lead frame and the fourth lead frame arranged away from each other.

19. The isolated switching power supply according to claim 15, wherein the third lead frame, the die pad and the fourth lead frame overlap each other in a first direction in which the first and second transistor chips are aligned.

20. The isolated switching power supply according to claim 15, further comprising:
a fifth lead frame disconnected to the controller chip.

21. The isolated switching power supply according to claim 20, wherein the fifth lead frame is shorter than the third and fourth lead frames.

22. The isolated switching power supply according to claim 15, wherein the first and second transistor chips are aligned in a first direction, and the first transistor has the source and a gate formed on a first surface thereof, and the source and the gate are aligned in a second direction perpendicular to the first direction.

23. The isolated switching power supply according to claim 15, wherein the first and second transistor chips are aligned in a first direction, and the second transistor has the source and a gate formed on a first surface thereof, and the source and the gate are aligned in a second direction perpendicular to the first direction.

24. A rectifier IC comprising:
a first transistor chip including a first transistor;
a second transistor chip including a second transistor;
a first controller chip operable to detect a first node voltage and a second node voltage of the first transistor so as to perform on/off control on the first transistor;
a second controller chip operable to detect a third node voltage and a fourth node voltage of the second transistor so as to perform on/off control on the second transistor;
a first lead frame on which the first transistor chip is mounted;
a second lead frame on which the second transistor chip is mounted;
a first die pad on which the first controller chip is mounted;
a second die pad on which the second controller chip is mounted;
a third lead frame connected to a source of the first transistor; and
a fourth lead frame connected to a source of the second transistor,
wherein the rectifier IC functions as a secondary-side rectifier of an isolated switching power supply,
wherein the first controller chip and the second controller chip are arranged between the first lead pin and the third lead pin,
wherein the first transistor chip, the second transistor chip, the first controller chip, and the second controller chip are sealed in a single package,
wherein the first and second lead frames are led out of the package at a first side thereof, and the third and fourth lead frames are led out of the package at a second side thereof, and
wherein the third and fourth lead frames are arranged at opposite ends, respectively, of the second side of the package.

25. The rectifier IC according to claim 24, wherein the first lead frame, the second lead frame, the first die pad, the second die pad, the third lead frame and the fourth lead frame arranged away from each other.

26. The rectifier IC according to claim 24, wherein the third lead frame, the first die pad, the second die pad and the fourth lead frame overlap each other in a first direction in which the first and second transistor chips are aligned.

27. The rectifier IC according to claim 24, further comprising:
a fifth lead frame disconnected to the first and second controller chips.

28. The rectifier IC according to claim 27, wherein the fifth lead frame is shorter than the third and fourth lead frames.

29. The rectifier IC according to claim 24, wherein the first and second transistor chips are aligned in a first direction, and the first transistor has the source and a gate formed on a first surface thereof, and the source and the gate are aligned in a second direction perpendicular to the first direction.

30. The rectifier IC according to claim 24, wherein the first and second transistor chips are aligned in a first direction, and the second transistor has the source and a gate formed on a first surface thereof, and the source and the gate are aligned in a second direction perpendicular to the first direction.

\* \* \* \* \*